US007884608B2

(12) United States Patent
Okamoto

(10) Patent No.: US 7,884,608 B2
(45) Date of Patent: Feb. 8, 2011

(54) MAGNETIC RESONANCE IMAGING APPARATUS AND RADIO FREQUENCY COIL UNIT

(75) Inventor: Kazuya Okamoto, Saitama (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 173 days.

(21) Appl. No.: 12/081,812

(22) Filed: Apr. 22, 2008

(65) Prior Publication Data

US 2008/0224701 A1  Sep. 18, 2008

Related U.S. Application Data

(62) Division of application No. 11/490,245, filed on Jul. 21, 2006, now Pat. No. 7,446,529.

(30) Foreign Application Priority Data

Jul. 21, 2005 (JP) .............................. P2005-211624

(51) Int. Cl.
  *G01V 3/00* (2006.01)
(52) U.S. Cl. ....................................... 324/318; 324/321
(58) Field of Classification Search ......... 324/300–322; 600/407–445
  See application file for complete search history.

(56) References Cited

U.S. PATENT DOCUMENTS

| 4,467,259 | A | 8/1984 | Duff |
| 4,620,155 | A | 10/1986 | Edelstein |
| 4,691,163 | A | 9/1987 | Blass et al. |
| 4,975,644 | A | 12/1990 | Fox |
| 5,208,534 | A | 5/1993 | Okamoto et al. |
| 5,216,367 | A | 6/1993 | Mori |
| 5,461,314 | A | 10/1995 | Arakawa et al. |
| 5,471,142 | A | 11/1995 | Wang |
| 5,483,158 | A | 1/1996 | Van Heteren et al. |
| 5,565,779 | A | 10/1996 | Arakawa et al. |
| 5,666,055 | A | 9/1997 | Jones et al. |
| 5,945,826 | A | 8/1999 | Leussler |
| 6,223,065 | B1 | 4/2001 | Misic et al. |
| 6,323,648 | B1 | 11/2001 | Belt et al. |
| 6,452,374 | B1 | 9/2002 | Kreischer |
| 6,486,671 | B1 * | 11/2002 | King ........................... 324/307 |

(Continued)

FOREIGN PATENT DOCUMENTS

DE  199 28 428 A1  1/2001

(Continued)

OTHER PUBLICATIONS

J. B. Ra et al., "Fast Imaging Using Subencoding Data Sets From Multiple Detectors", 1993, MRM 30, pp. 142-145.

(Continued)

*Primary Examiner*—Brij B Shrivastav
(74) *Attorney, Agent, or Firm*—Nixon & Vanderhye PC

(57) ABSTRACT

A radio frequency coil unit includes a plurality of surface coils and a distributing/combining unit. The plurality of surface coils are arranged in a body-axis direction. The distributing/combining unit distributes and combines reception signals output from the plurality of surface coils to generate a new reception signal.

14 Claims, 14 Drawing Sheets

U.S. PATENT DOCUMENTS

| | | | |
|---|---|---|---|
| 6,870,368 B2 * | 3/2005 | Visser et al. | 324/318 |
| 6,930,481 B2 * | 8/2005 | Okamoto et al. | 324/318 |
| 6,998,843 B2 * | 2/2006 | Okamoto et al. | 324/318 |
| 7,026,818 B2 | 4/2006 | Machida et al. | |
| 7,109,713 B2 * | 9/2006 | Okamoto et al. | 324/318 |
| 7,176,689 B2 * | 2/2007 | Machida et al. | 324/318 |
| 7,227,361 B2 * | 6/2007 | Okamoto et al. | 324/318 |
| 7,385,397 B2 * | 6/2008 | Uchizono et al. | 324/318 |
| 7,446,529 B2 * | 11/2008 | Okamoto | 324/318 |
| 7,649,353 B2 * | 1/2010 | Feiweier et al. | 324/309 |
| 2009/0224761 A1 * | 9/2009 | Umeda | 324/312 |
| 2009/0309594 A1 * | 12/2009 | Feiweier et al. | 324/309 |

FOREIGN PATENT DOCUMENTS

| | | |
|---|---|---|
| JP | 4-212329 | 8/1992 |
| JP | 11-076194 | 3/1999 |
| JP | 2001-46356 | 2/2001 |
| WO | WO 99/27381 | 6/1999 |
| WO | WO 99/53333 | 10/1999 |
| WO | WO 99/54746 | 10/1999 |
| WO | WO 02/056767 | 7/2002 |

OTHER PUBLICATIONS

K. P. Pruessmann et al., "Sense: Sensitivity Encoding for Fast MRI", Magnetic Resonance in Medicine 42, pp. 952-962 (1999).

Inventor: Ludwig Kreischer, Patent Abstracts of Japan, Publication No. 2001-046356, Feb. 20, 2001, pp. 1-2.

K. Okamoto et al., U.S. Appl. No. 10/234,242, filed Aug. 5, 2002, pp. 1-40.

Reykowski et al., "Mode Matrix-A Generalized Signal Combiner for Parallel Imaging Arrays", Proceedings International Society of Magnetic Resonance in Medicine, 11(2004), p. 1587.

* cited by examiner

MAGNETIC RESONANCE IMAGING APPARATUS AND RADIO FREQUENCY COIL UNIT

CROSS-REFERENCE TO RELATED APPLICATIONS

This application is a divisional of U.S. patent application Ser. No. 11/490,245 filed Jul. 21, 2006 (now issued as U.S. Pat. No. 7,446,529), and which claimed priority from Japanese Application No. 2005-211,624 filed Jul. 21, 2005, the entire disclosures of which priority applications are incorporated herein by reference. This application is also related to commonly assigned U.S. Pat. Nos. 7,176,689 (Machida, et al.), 6,930,481 (Okamoto, et al.), 6,998,843 (Okamoto, et al.), 7,109,713 (Okamoto, et al.) and 7,227,361 (Okamoto, et al.).

BACKGROUND OF THE INVENTION

1. Field of the Invention

The present invention relates to a magnetic resonance imaging apparatus which obtains a magnetic resonance signal generated by applying a gradient magnetic field and a radio frequency pulse into an object in a static magnetic field and reconstructs an image of the object using the obtained magnetic resonance signal, and a radio frequency coil unit. More particularly, this invention relates to a magnetic resonance imaging apparatus including a plurality of surface coils for receiving a magnetic resonance signal and a radio frequency coil unit.

2. Description of the Related Art

According to a related art, a magnetic resonance imaging apparatus is used as a monitoring apparatus in the medical field. The magnetic resonance imaging apparatus forms gradient magnetic fields in X axis, Y axis and Z axis directions using a gradient magnetic field coil in an imaging area of the object disposed in a tubular magnet forming a static magnetic field and transmits a RF (radio frequency) signal from a RF (radio frequency) coil to resonate a nuclear spin in an object. The magnetic resonance imaging apparatus further reconstructs a MR image of the object using an excited NMR signal.

In the magnetic resonance imaging apparatus as described above, surface coils are disposed in a plurality of target regions of the object in order to receive a NMR signal, which makes it possible to rapidly take an image as compared with a technique according to the related art referred to as parallel imaging.

FIG. 15 is a diagram showing an example in which a plurality of surface coils are disposed around an abdominal region of the object in parallel imaging by a magnetic resonance imaging apparatus according to a related art.

As shown in FIG. 15, when imaging the whole abdominal region of the object P, generally, a plurality of surface coils 1 are arranged to surround the object P. A magnetic resonance imaging apparatus is configured to obtain a NMR signal from the whole abdominal region of the object by the surface coils 1. Therefore, the magnetic resonance imaging apparatus can obtain an image for every imaging area with good sensitivity by appropriately arranging the plurality of surface coils for each of the imaging areas. FIG. 15 is a view showing an example that receives reception signals from six surface coils 1 through six receiving channels 2.

According to the parallel imaging method, it is possible to reduce a data acquisition time to 1/n (n is a number of coils arranged in an encode direction when acquiring the maximum number of image data). When imaging an axial section of a body of FIG. 15, if the encode direction is x-direction, three surface coils are arranged. Therefore, the data acquisition time can be approximately reduced to ⅓.

The parallel imaging method is further developed in recent years, and high speed imaging can be performed with reduced error. Therefore, the number of surface coils or the number of receiving channels of a system tends to be increased. For example, a system in which four to thirty-two channels are provided even for a magnetic resonance imaging apparatus having a smaller number of surface coils is produced.

However, there is a problem in that since it is required to dispose the surface coils for every imaging area, the number of surface coils is increased. Further, whenever the object or the imaging area is changed, the user needs to change the surface coils correspondingly to the imaging area. Therefore, the user needs to sufficiently prepare surface coils dedicated to imaging areas. However, changing the surface coil is troublesome for a doctor or an operator.

Generally, in the magnetic resonance imaging apparatus, it is required that the number of receiving channels corresponds to the maximum number of the coils that are used in the imaging area. Therefore, even when the number of surface coils is large, if the number of receiving channels of the magnetic resonance imaging apparatus is small, the number of surface coils that are to be simultaneously used is limited. As a result, there is a problem in that the surface coils can not receive the signals from a larger region the body of the object.

A magnetic resonance imaging apparatus in which a switch circuit or a combining circuit (Matrix) is provided for a plurality of surface coils arranged in a X-axis direction vertical to a body axis of the object to select a mode of a combination of surface coils used for receiving a signal has been suggested (for example, JP-A-2003-334177). In the magnetic resonance imaging apparatus having the switch circuit or the combining circuit, signals received from a proper number of surface coils are combined by selecting a mode of the corresponding surface coil, which makes it possible to perform parallel imaging with a number of channels smaller than that of the surface coils. In JP-A-2003-334177, a switch circuit that is capable of outputting reception signals received by maximum eight surface coils as at least one reception signal is suggested.

FIG. 16 is a conceptual diagram showing an example configured to combine reception signals received by a plurality of surface coils using a combining/switch circuit in parallel imaging by a magnetic resonance imaging apparatus according to a related art.

As shown in FIG. 16, when six surface coils 1 are arranged around the abdominal region of an object P, two combining circuits 3 are provided. Therefore, when the combining circuit 3 combines the signals from three surface coils 1 to one signal and then outputs it, it is possible to receive the reception signals from the six surface coils 1 through two receiving channels 2.

It is further possible to combine various types of reception signals from the respective surface coils and select a mode of reception signals by providing a distributing/combining circuit (for example, refer to "Mode Matrix—A Generalized Signal Combiner For Parallel Imaging Arrays" A. Reykowski, M. Blasche, 2004 Proceedings On CD-ROM, International Society for Magnetic Resonance in Medicine, Twelfth scientific meeting, Kyoto, Japan 15-21 May 2004, pp 1587).

FIG. 17 is a diagram showing a sensitivity distribution of three target surface coils among six surface coils arranged around the abdominal region of the object in parallel imaging by a magnetic resonance imaging apparatus according to a related art. FIG. 18 is a circuit diagram of the distributing/ combining circuit for combining signals received from the target surface coils in the magnetic resonance imaging apparatus according to a related art, as shown in FIG. 17.

It is possible to set a plurality of modes in order to combine signals received from the three surface coils L, M, R having the sensitivity distribution 4 as shown in FIG. 17. For example, as shown in FIG. 18, the distributing/combining circuit 5 is configured by a 0°-180° hybrid circuit 6 and a 0°-90° hybrid circuit 7. A signal obtained by combining two input signals is output from a 0° output side of the 0°-180° hybrid circuit 6, and a composite signal obtained by combining two signals whose phases are shifted by 180° is output from a 180° output side of the 0°-180° hybrid circuit 6. Further, a signal obtained by combining two input signals is output from a 0° output side of the 0°-90° hybrid circuit 7, and a composite signal obtained by combining two signals whose phases are shifted by 90° is output from a 90° output side of the 0°-90° hybrid circuit 7.

More specifically, the 0°-180° hybrid circuit 6 is provided at output sides of the surface coils L and R, and the 0°-90° hybrid circuit 7 is provided at the 180° output side of the 0°-180° hybrid circuit 6 and an output side of the surface coil M. A signal output from a channel at the 0° output side of the 0°-180° hybrid circuit 6 is denoted by a signal B, a signal output from a channel at the 0° output side of the 0°-90° hybrid circuit 7 is denoted by a signal C, and a signal output from a channel at the 90° output side of the 0°-90° hybrid circuit 7 is denoted by a signal A.

With this configuration, the signal B is a signal that combines (adds) a reception signal from the surface coil L and a reception signal from the surface coil R. Further, the signal A is a QD signal corresponding to a reception signal from a QD (quadrature detection) surface coil arranged by overlapping a figure-of-eight-shaped surface coil consisting of the surface coils L and R and the surface coil M as a loop surface coil. The signal C is an anti-QD signal that is reversed with the QD signal.

It is known that the QD surface coil can improve SNR (signal to noise ratio) by shifting the phases of the reception signal from the loop surface coil and the reception signal from the figure-of-eight-shaped surface coil by 90° and adding them. In this case, in order to combine the signal from the surface coil M corresponding to the loop surface coil and composite signal of the surface coils L and M that are shifted 180° and forms the figure-of-eight-shaped coil, the 0°-90° hybrid circuit 7 is used.

FIG. 19 is a diagram showing the sensitivity distribution 4 formed by the surface coils L, M, R when the output signal A from the distributing/combining circuit 5 shown in FIG. 18 according to a related art is selected as a reception signal, FIG. 20 is a diagram showing the sensitivity distribution 4 formed by the surface coils L, M, R when the output signal C from the distributing/combining circuit 5 shown in FIG. 18 according to a related art is selected as a reception signal, and FIG. 21 is a diagram showing the sensitivity distribution 4 formed by the surface coils L, M, R when the output signal B from the distributing/combining circuit 5 shown in FIG. 18 according to a related art is selected as a reception signal.

As shown in FIGS. 19, 20, and 21, when performing mode selection by combining the reception signals from the surface coils L, M, R, it is possible to form a plurality of different sensitivity regions 4 by the combination of the same surface coils L, M, R without changing the surface coils L, M, R. Therefore, it is further possible to obtain three image patterns that are reconfigured by the reception signals. Furthermore, it is possible to select a reception signal that is used for imaging in accordance to the number of reception channels included a receiving system of the magnetic resonance imaging apparatus.

For example, as shown in FIG. 17, when six surface coils 1 are provided, a distributing/combining circuit same as the distributing/combining circuit 5 shown in FIG. 18 is provided for three surface coils 1 that face the three surface coils L, M, R. Therefore, when output signals corresponding to the signals A, B, C are denoted as signals A', B', C', respectively, and the number of receiving channels provided in the receiving system is two, it is possible to select the signals A and A' as the reception signals. Since the QD signal has a wide sensitivity region, it is possible to image a wider area even when the number of the reception channel is only two.

Further, when the number of the receiving channels provided in the receiving system is four, the signals A, B, A', and B' can be selected as the reception signals to be used for imaging. When the number of the receiving channels provided in the receiving system is six, the signals A, B, C, A', B', C' can be selected as the reception signals to be used for imaging. Therefore, it is possible to perform high speed imaging corresponding to the number of receiving channels.

Recently, a magnetic resonance imaging apparatus includes a switch circuit that selects or combines reception signals from the surface coils so as to perform parallel imaging even when the number of receiving channels, M and the number of surface coils, N satisfies the relationship of N≧M.

However, in the magnetic resonance imaging apparatus according to the related art, if the number of surface coils increases, when the switch circuit performs both selection and combination of the reception signals, there are problems such as the complicated arrangement of the switch circuit, increased size of the circuit board, increased power consumption, and difficulty in quality insurance.

Further, in recent years, in order to image a wider range, a magnetic resonance imaging apparatus in which a plurality of surface coils are arranged not only in XY direction vertical to a body axis of the object, but also in the body-axis direction is suggested. In the magnetic resonance imaging apparatus having the above mentioned structure, when the number of receiving channels in the body-axis direction is small, it is difficult to cover signals from a wide region of the body of the object regardless of the plurality of surface coils. On the other hand, when the switch circuit selects a reception signal in the body-axis direction, the circuit becomes complicated due to the increased number of the surface coils.

SUMMARY OF THE INVENTION

Accordingly, this invention is made in consideration of the problems according to the related art, and an object of the present invention is to provide a magnetic resonance imaging apparatus that is capable of realizing a wider imaging area with a reduced number of receiving channels without using a complicated configuration of a circuit even though the number of surface coils is increased and arranged in a body-axis direction, and a radio frequency coil unit.

In order to achieve the above object, a radio frequency coil unit according to an aspect of this invention includes a plurality of surface coils arranged in a body-axis direction of an object and a distributing/combining unit that produces a new reception signal by distributing and combining reception signals from the plurality of surface coils in the body-axis direction.

Further, a radio frequency coil unit according to another aspect of this invention includes a plurality of surface coils and a distributing/combining unit that includes only 0°-180° hybrid circuit as a passive circuit and inputs reception signals from the plurality of surface coils to the 0°-180° hybrid circuit and distributes and combines the input reception signals in the 0°-180° hybrid circuit to produce a new reception signal.

A magnetic resonance imaging apparatus according to still another aspect of this invention includes a signal generating unit that generates a magnetic resonance signal by applying a gradient magnetic field and a radio frequency pulse to an object that is disposed in a static magnetic field, a plurality of surface coils that are arranged in a body-axis direction of the object and receives the magnetic resonance signal, a distributing/combining unit that distributes and combines the reception signals input from the plurality of surface coils to produce a new reception signal, a switch that selects reception signals from the new reception signal generated by the distributing/combining unit, the number of the reception signals corresponding to the number of receiving channels, a receiving unit that obtains the reception signal selected by the switch, and an image reconstructing unit that reconstructs an image of the object on the bases of the reception signal obtained by the receiving unit.

A magnetic resonance imaging apparatus according to still another aspect of this invention includes a signal generating unit that generates a magnetic resonance signal by applying a gradient magnetic field and a radio frequency pulse to an object that is disposed in a static magnetic field, a plurality of surface coils that receives the magnetic resonance signal, a distributing/combining unit that includes only 0°-180° hybrid circuit as a passive circuit and inputs reception signals from the plurality of surface coils to the 0°-180° hybrid circuit and distributes and combines the input reception signals in the 0°-180° hybrid circuit to produce a new reception signal, a switch that selects reception signals, the number of the reception signals corresponding to the number of receiving channels from the new reception signal generated by the distributing/combining unit, a receiving unit that obtains a reception signal selected by the switch, and an image reconstructing unit that reconstructs an image of the object on the bases of the reception signal obtained by the receiving unit.

According to the magnetic resonance imaging apparatus and the radio frequency coil unit of this invention, it is possible to realize a wider imaging area with a reduced number of receiving channels without using a complicated configuration of a circuit even though the number of surface coils is increased and arranged in a body-axis direction, and a radio frequency coil unit.

DESCRIPTION OF THE PREFERRED EMBODIMENTS

Embodiments of a magnetic resonance imaging apparatus and a radio frequency coil unit according to this invention will be described with reference to accompanying drawings.

Figure 1:
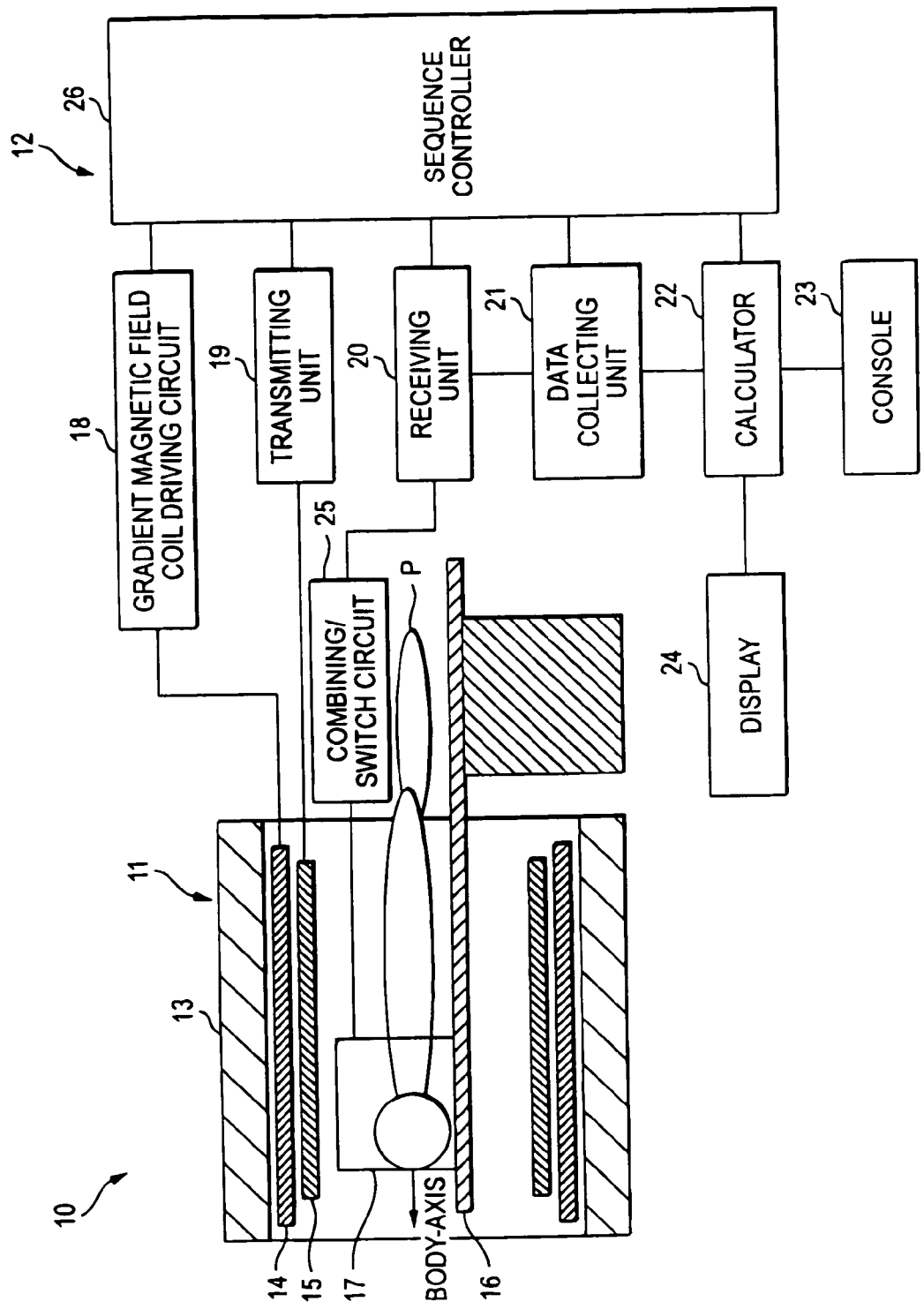
FIG. 1 is a configuration diagram showing an embodiment of a magnetic resonance imaging apparatus according to this invention.

FIG. 1 is a configuration diagram showing an embodiment of a magnetic resonance imaging apparatus according to this invention.

The magnetic resonance imaging apparatus 10 has a gantry 11 and a control system 12. The gantry 11 is configured by coaxially forming a tubular gradient magnetic field coil unit 14 in a tubular static magnetic field magnet 13 and a tubular transmitting radio frequency coil 15. A bed 16 is provided inside the transmitting radio frequency coil 15 and an object P to be examined is set on the bed 16. A receiving radio frequency coil 17 is provided in an imaging area of the object P. The control system 12 includes a gradient magnetic field coil driving circuit 18, a transmitting unit 19, a receiving unit 20, a data collecting unit 21, a calculator 22, a console 23, a display 24, a combining/switch circuit 25, and a sequence controller 26. All or a part of the combining/switch circuit 25 includes a part of the receiving radio frequency coil 17 to form a radio frequency coil unit.

The static magnetic field magnet 13 has a function of uniformly applying a static magnetic field to the object P set in the imaging area. The gradient magnetic field coil unit 14 includes an X-axis gradient magnetic field coil, a Y-axis gradient magnetic field coil, and a Z-axis gradient magnetic field coil (which are not shown), and functions to form gradient magnetic fields Gx, Gy, Gz in the imaging area, the densities of the magnetic fields are linearly changed in X-axis, Y-axis, Z-axis directions in response to a driving signal from the gradient magnetic field coil driving circuit 18. The transmitting radio frequency coil 15 transmits a radio frequency pulse to the object P disposed in the imaging area according to a radio frequency pulse received from the transmitting unit 19.

The receiving radio frequency coil 17 includes a plurality of surface coils and has functions to receive a magnetic resonance signal generated by the radio frequency pulse that is supplied from the transmitting radio frequency coil 15 to the object P and output the received magnetic resonance signal to the combining/switch circuit 25 as an electrical signal. The combining/switch circuit 25 inputs a reception signal from each surface coil of the receiving radio frequency coil 17 and combines and selects the input reception signal to supply an output signal to the receiving unit 20 as a reception signal.

The gradient magnetic field coil driving circuit 18 supplies driving signals to the X-axis gradient magnetic field coil, the Y-axis gradient magnetic field coil, and the Z-axis gradient magnetic field coil of the gradient magnetic field coil unit 14 according to a control signal (sequence) received from the sequence controller 26 to form desired gradient magnetic fields Gx, Gy, Gz in the imaging area.

The transmitting unit 19 supplies the radio frequency pulse to the transmitting radio frequency coil 15 according to the control signal (sequence) received from the sequence controller 26 to apply the radio frequency signal to the object P. The receiving unit 20 has a plurality of receiving channels and under control by the sequence controller 26, the reception signals received from the combining/switch circuit 25 are amplified and detected through receiving channels to be supplied to a data collecting unit 21.

The data collecting unit 21 collects the magnetic resonance signals received as reception signals from the receiving unit 20 through the receiving channels under the control by the sequence controller 26, and A to D converts the signals to supply the calculator 22. The calculator 22 is controlled by a control signal from the console 23, and performs image reconstructions of the magnetic resonance signal acquired from the data collecting unit 21 to produce image data of the object P. The produced image data is supplied to the display 24 to be displayed.

Figure 2:
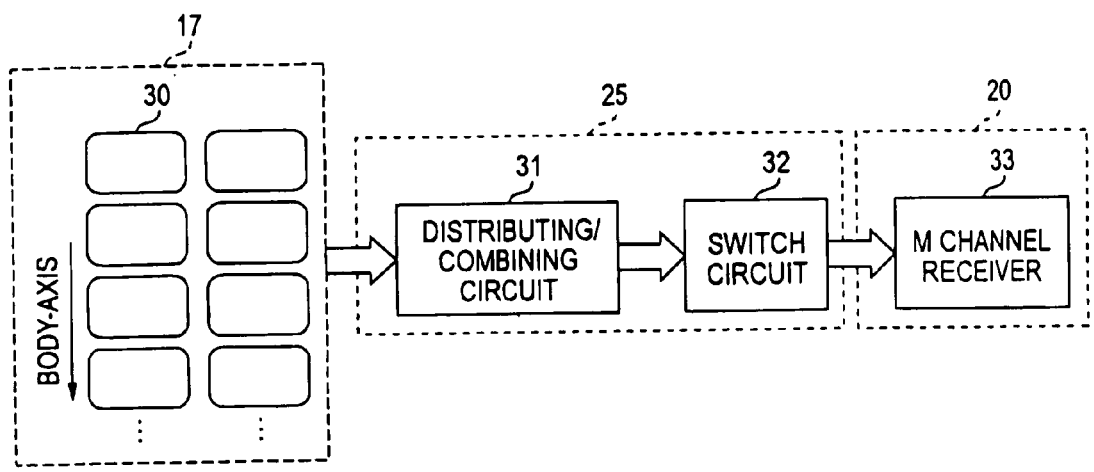
FIG. 2 is a circuit diagram of receiving radio frequency coil and a combining/switch circuit of the magnetic resonance imaging apparatus shown in FIG. 1.

FIG. 2 is a circuit diagram of a receiving radio frequency coil 17 and a combining/switch circuit 25 of the magnetic resonance imaging apparatus shown 10 in FIG. 1.

As shown in FIG. 2, the receiving radio frequency coil 17 includes a plurality of surface coils 30. The number of the surface coils 30 arranged in a predetermined position of a body direction of the object P and a direction vertical to the body axis is preferably N, respectively. In this case, at least two surface coils 30 that are shifted in the body-axis direction of the object P are provided. Generally, the body-axis direction of the object P is Z axis.

The combining/switch circuit 25 can be configured by connecting a distributing/combining circuit 31 and a switch circuit 32. N reception signals are input from N surface coils 30 to the distributing/combining circuit 31, the distributing/combining circuit 31 distributes and combines the input reception signals to produce N reception signals and to output the produced N reception signals to the switch circuit 32. That is, the combining/switch circuit 25 produces a predetermined reception signal on the basis of the reception signal from the surface coils 30 in accordance with a proper method. The combining/switch circuit 25 is configured by a passive circuit in which the driving power supply is not required. As a result, it is possible to achieve reduced power consumption. Further, when the distributing/combining characteristic of the distributing/combining circuit 31 is represented by a N×N matrix having a determinant in which the value is not zero, that is, when the characteristic is represented by a matrix that has an inverse matrix, it is possible to effectively use the reception signal from the surface coils 30 without discarding.

The switch circuit 32 selects M reception signals that satisfy the relationship of N≧M, from N reception signals received from the distributing/combining circuit 31. The selected reception signals is output to M channel receiver 33 provided in the receiving unit 20. That is, the switch circuit 32 has a function for modally selecting and switching the N reception signals received from the distributing/combining circuit 31 in accordance with M that is the number of receiving channels in the receiving unit 20.

Therefore, the configuration of the distributing/combining circuit 31 is determined depending on the number N of the surface coils 30 or arrangement thereof. Meanwhile, the switch circuit 32 can be properly designed so as to select the M reception signals. In this case, when the radio frequency coil unit is formed by the plurality of surface coils 30 and the corresponding distributing/combining circuit 31, it is possible to easily switch N radio frequency coil units in accordance with the diagnosis object. Further, when the distributing/combining circuit 31 is configured by a passive circuit in which the driving power supply is not required, it is possible to simplify the circuit arrangement of the radio frequency coil unit.

Figure 3:
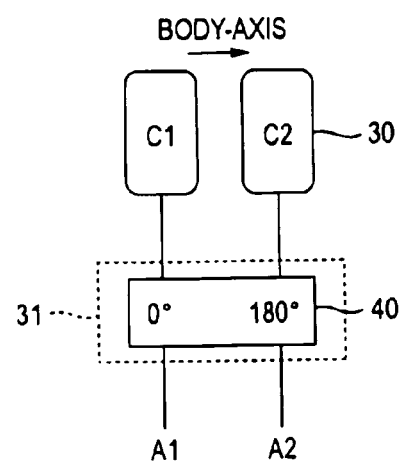
FIG. 3 is a diagram showing a configuration example of the distributing/combining circuit shown in FIG. 2.

FIG. 3 is a diagram showing a configuration example of the distributing/combining circuit 31 shown in FIG. 2.

As shown in FIG. 3, the distributing/combining circuit 31 can be configured by a 0°-180° hybrid circuit 40 that is an example of the passive circuit. FIG. 3 shows an example when the number N of surface coils 30 is 2. The 0°-180° hybrid circuit 40 is provided at output sides of two surface coils C1 and C2 that are shifted in the body-axis direction of the object P. With this configuration, a signal A1 obtained by adding the reception signals from the surface coils C1 and C2 is output from 0° side of the 0°-180° hybrid circuit 40 to as a reception signal. Further, a signal A2 obtained by adding the reception signals from the surface coils C1 and C2 whose phases are shifted by 180° is output from 180° side of the 0°-180° hybrid circuit 40 as a reception signal.

Figure 4:
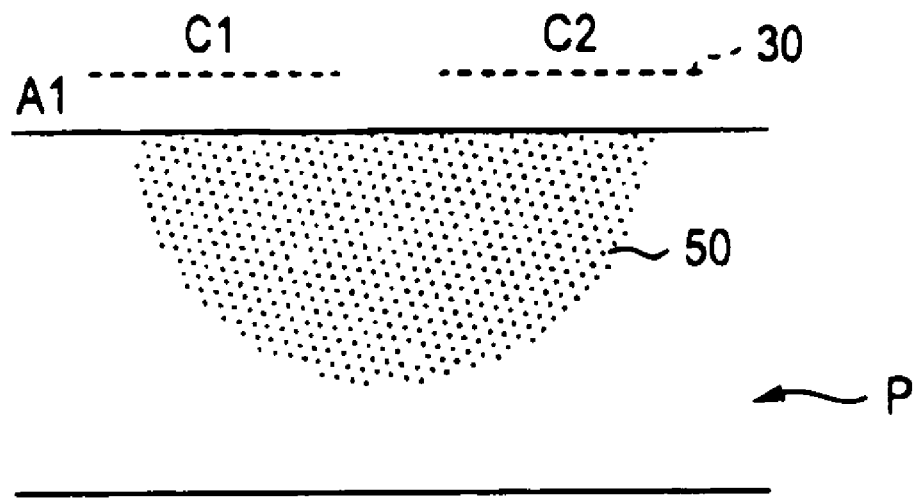
FIG. 4 is a diagram showing sensitivity distribution formed by surface coils when a signal output from a 0° side of a 0°-180° hybrid circuit shown in FIG. 3 is selected as a reception signal.
Figure 5:
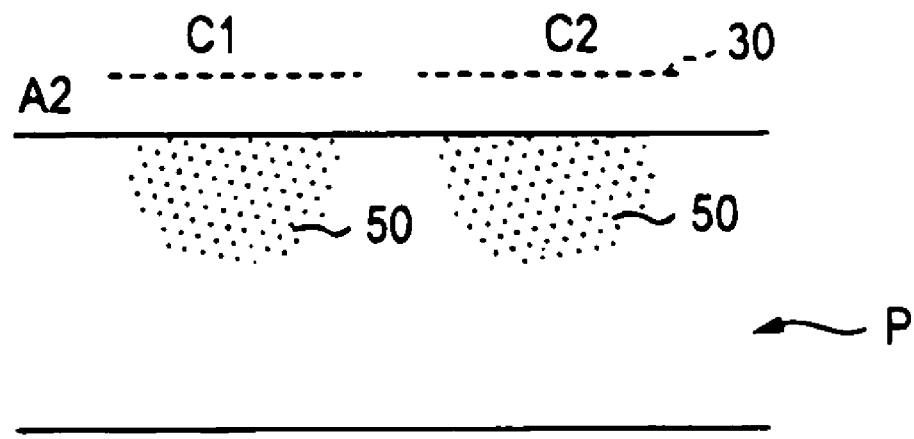
FIG. 5 is a diagram showing sensitivity distribution formed by surface coils when a signal output from a 180° side of the 0°-180° hybrid circuit shown in FIG. 3 is selected as a reception signal.

FIG. 4 is a diagram showing a sensitivity distribution formed by the surface coils C1 and C2 when the output signal A1 from the 0° side of the 0°-180° hybrid circuit 40 shown in FIG. 3 is selected as a reception signal and FIG. 5 is a diagram showing a sensitivity distribution formed by the surface coils C1 and C2 when an output signal A2 from the 180° side of the 0°-180° hybrid circuit 40 shown in FIG. 3 is selected as a reception signal.

As shown in FIGS. 4 and 5, by selecting and combining the reception signals from the two surface coils C1 and C2 using the 0°-180° hybrid circuit 40, it is possible to form two sensitivity distributions 50 without switching the surface coils C1 and C2. As a result, it is possible to select the reception signal to be used for imaging in accordance to the number of receiving channels provided in the receiving unit 20 of the magnetic resonance imaging apparatus 10. Further, since only one of the surface coils 30 can be used to obtain two kinds of reception signals, it is possible to suppress increase in number of the surface coils.

However, the number of surface coils 30 is not limited to two, and a predetermined number N of surface coils 30 can be arranged around the object P depending on the object of diagnosis. Therefore, as mentioned above, the distributing/combining circuit 31 is configured in accordance to the coil number N of the surface coils 30.

Figure 6:
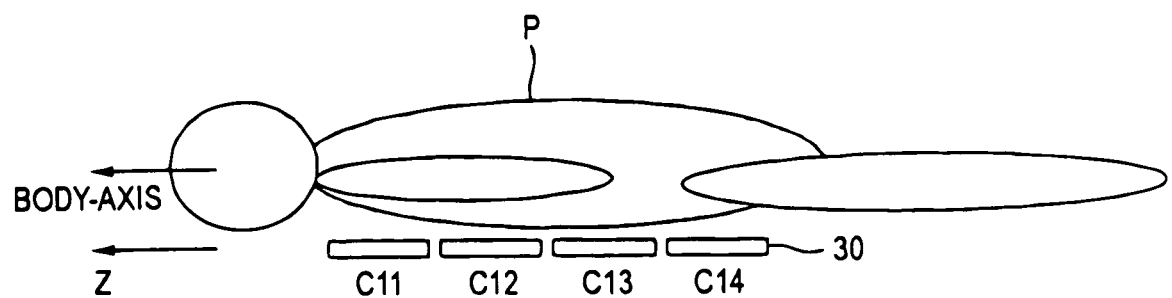
FIG. 6 is a diagram showing an example in which four surface coils are arranged at a back side of an object as receiving radio frequency coils of the magnetic resonance imaging apparatus shown in FIG. 1.

FIG. 6 is a diagram showing an example in which four surface coils 30 are arranged at a back side of the object P as a receiving radio frequency coil 17 of the magnetic resonance imaging apparatus 10 shown in FIG. 1

As shown in FIG. 6, when the four surface coils C11, C12, C13 and C14 are arranged in the body-axis direction at a back side of the object P, it is possible to collect reception data for diagnosis in the imaging area. Even though FIG. 6 shows the example in which the four surface coils C11, C12, C13 and C14 are arranged at a back side of the object P, it may be more preferable to collect reception data for diagnosis when four or more surface coils 30 are arranged around the object P other than the back side thereof.

Figure 7:
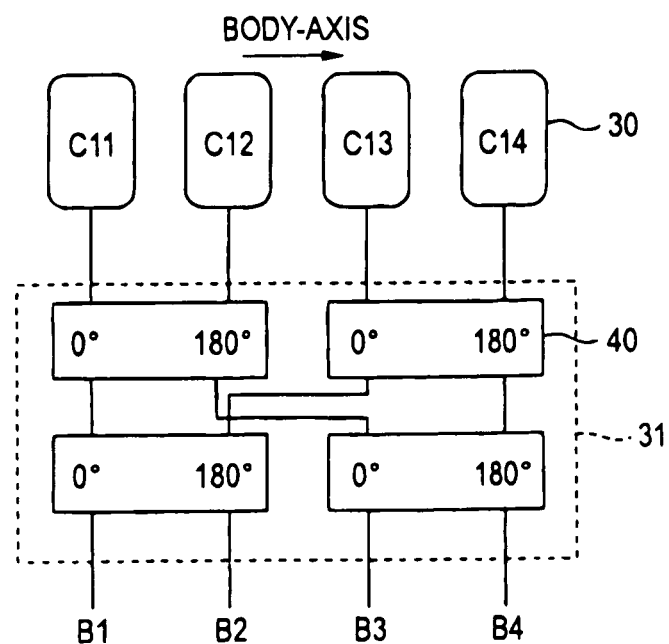
FIG. 7 is a diagram showing a configuration example of the distributing/combining circuit when four surface coils are used as receiving radio frequency coils of the magnetic resonance imaging apparatus shown in FIG. 1.

FIG. 7 is a diagram showing a configuration example of the distributing/combining circuit 31 when four surface coils C11, C12, C13, and C14 are used as a receiving radio frequency coil 17 of the magnetic resonance imaging apparatus 10 shown in FIG. 1.

As shown in FIG. 7, when the four surface coils C11, C12, C13, and C14 are used as receiving radio frequency coils 17, it is possible to form the distributing/combining circuit 31 using four 0°-180° hybrid circuit 40. That is, a first 0°-180° hybrid circuit 40 is provided at both output sides of the surface coils C11 and C12. Further, a second 0°-180° hybrid circuit 40 is provided at output sides of the surface coils C13 and C14.

Next, a third 0°-180° hybrid circuit 40 is provided at a 0° output side of the 0°-180° hybrid circuit 40 provided at the output sides of the surface coils C11 and C12 and at a 0° output side of the 0°-180° hybrid circuit 40 provided at the output sides of the surface coils C13 and C14. A fourth 0°-180° hybrid circuit 40 is provided at a 180° output side of the 0°-180° hybrid circuit 40 provided at output sides of the surface coils C11 and C12 and at a 180° output side of the 0°-180° hybrid circuit 40 provided at output sides of the surface coils C13 and C14.

The output signals from the 0° output side and the 180° output side of the third 0°-180° hybrid circuit 40 are referred to as B1 and B2, respectively, and the output signals from the 0° output side and the 180° output side of the fourth 0°-180° hybrid circuit 40 are referred to as B3 and B4, respectively. With this configuration, it is possible to obtain reception signals by forming sensitivity regions 50 that are varied depending on four modes of the four surface coils C11, C12, C13, C14.

Figure 8:
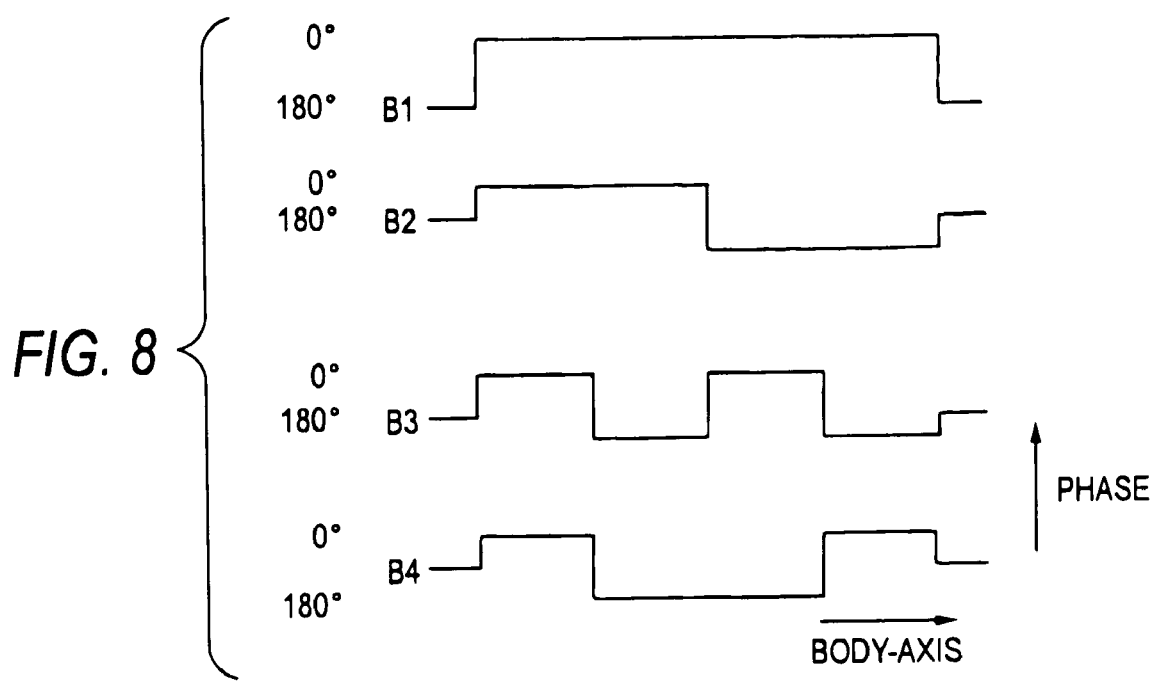
FIG. 8 is a diagram showing a phase profile when output signals output from the distributing/combining circuit shown in FIG. 7 are used as reception signals.
Figure 9:
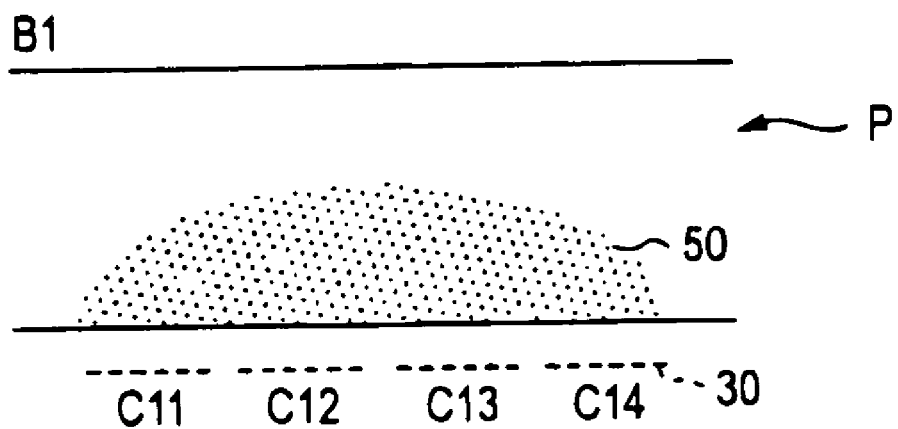
FIG. 9 is a diagram showing a sensitivity distribution formed by the surface coils when an output signal B1 output from the distributing/combining circuit shown in FIG. 7 is selected as a reception signal.
Figure 10:
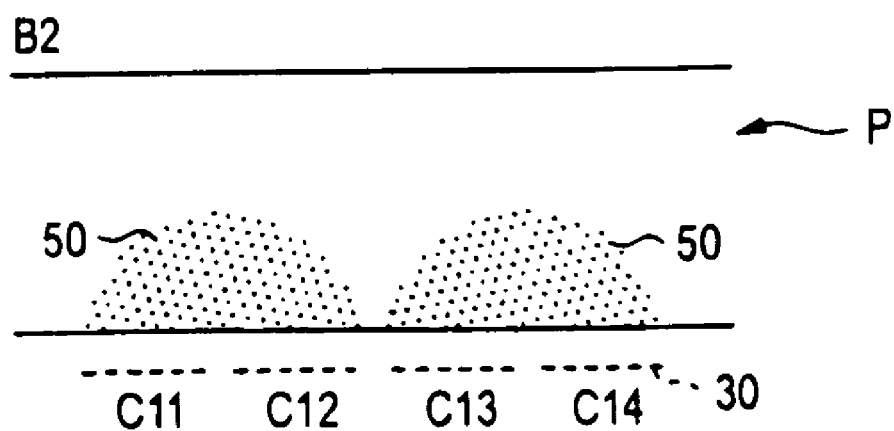
FIG. 10 is a diagram showing a sensitivity distribution formed by the surface coils when an output signal B2 output from the distributing/combining circuit shown in FIG. 7 is selected as a reception signal.
Figure 11:
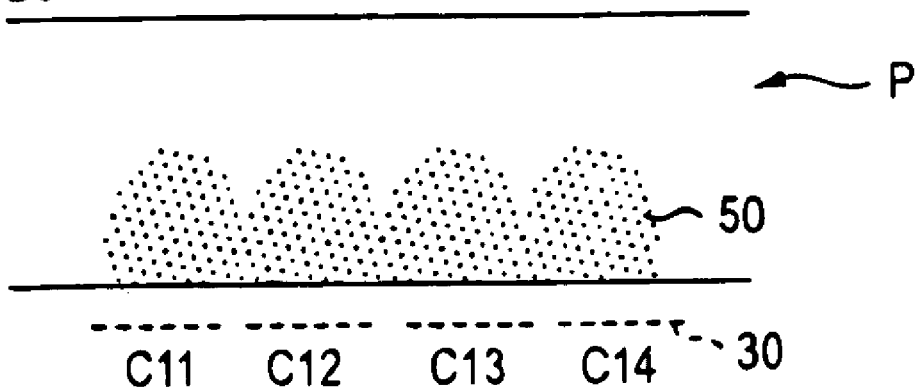
FIG. 11 is a diagram showing a sensitivity distribution formed by the surface coils when an output signal B3 output from the distributing/combining circuit shown in FIG. 7 is selected as a reception signal.
Figure 12:
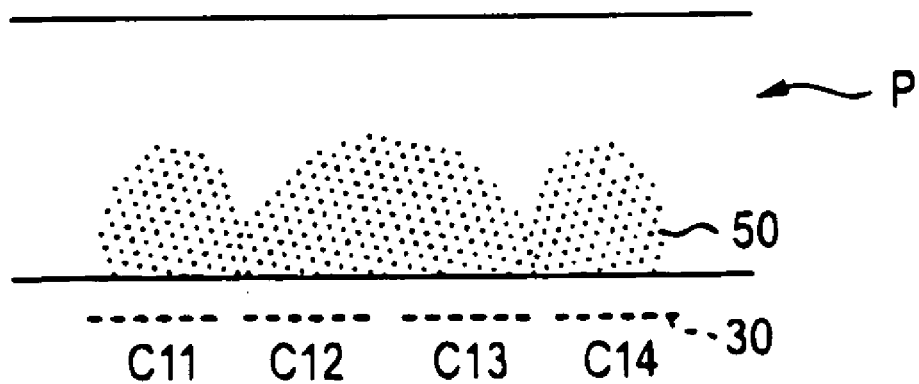
FIG. 12 is a diagram showing a sensitivity distribution formed by the surface coils when an output signal B4 output from the distributing/combining circuit shown in FIG. 7 is selected as a reception signal.

FIG. 8 is a diagram showing a phase profile when output signals B1, B2, B3, B4 output from the distributing/combining circuit 31 shown in FIG. 7 are used as reception signals, FIG. 9 is a diagram showing a sensitivity distribution formed by the surface coils C11, C12, C13, C14 when an output signal B1 output from the distributing/combining circuit 31 shown in FIG. 7 is selected as a reception signal, FIG. 10 is a diagram showing a sensitivity distribution formed by the surface coils C11, C12, C13, C14 when an output signal B2 output from the distributing/combining circuit 31 shown in FIG. 7 is selected as a reception signal, FIG. 11 is a diagram showing a sensitivity distribution formed by the surface coils C11, C12, C13, C14 when an output signal B3 output from the distributing/combining circuit 31 shown in FIG. 7 is selected as a reception signal, and FIG. 12 is a diagram showing a sensitivity distribution formed by the surface coils C11, C12, C13, C14 when an output signal B4 output from the distributing/combining circuit 31 shown in FIG. 7 is selected as a reception signal.

As shown in FIGS. 8, 9, 10, 11, and 12, by distributing and combining the reception signals from the four surface coils C11, C12, C13, C14 using the distributing/combining circuit 31 configured by four 0°-180° hybrid circuit 40, it is possible to output the reception signals to the receiving unit 20 by switching four modally switchable sensitivity regions 50. Therefore, even when the coil number N of the surface coils 30 is four (N=4), it is possible to switch the reception signals used for imaging in accordance to the receiving channel number M provided in the receiving unit 20, in the same way as the case when the coil number N is two (N=2). As a result, it is further possible to reconstruct images having various patterns using a reduced number of receiving channels and surface coils 30.

The plurality of surface coils 30 may be disposed in not only a body-axis direction but also a direction vertical to the body axis (XY direction when the body axis corresponds to a Z direction). Further, the reception signals that are obtained from the plurality of coils 30 disposed in the direction vertical to the body axis are distributed and combined by the distributing/combining circuit.

For example, the surface coils 30 for a head of the object P may be configured by providing a plurality of sets of surface coil units, each of which has three surface coils 30 that are arranged in an XY direction when the body axis is a Z-axis direction.

Figure 13:
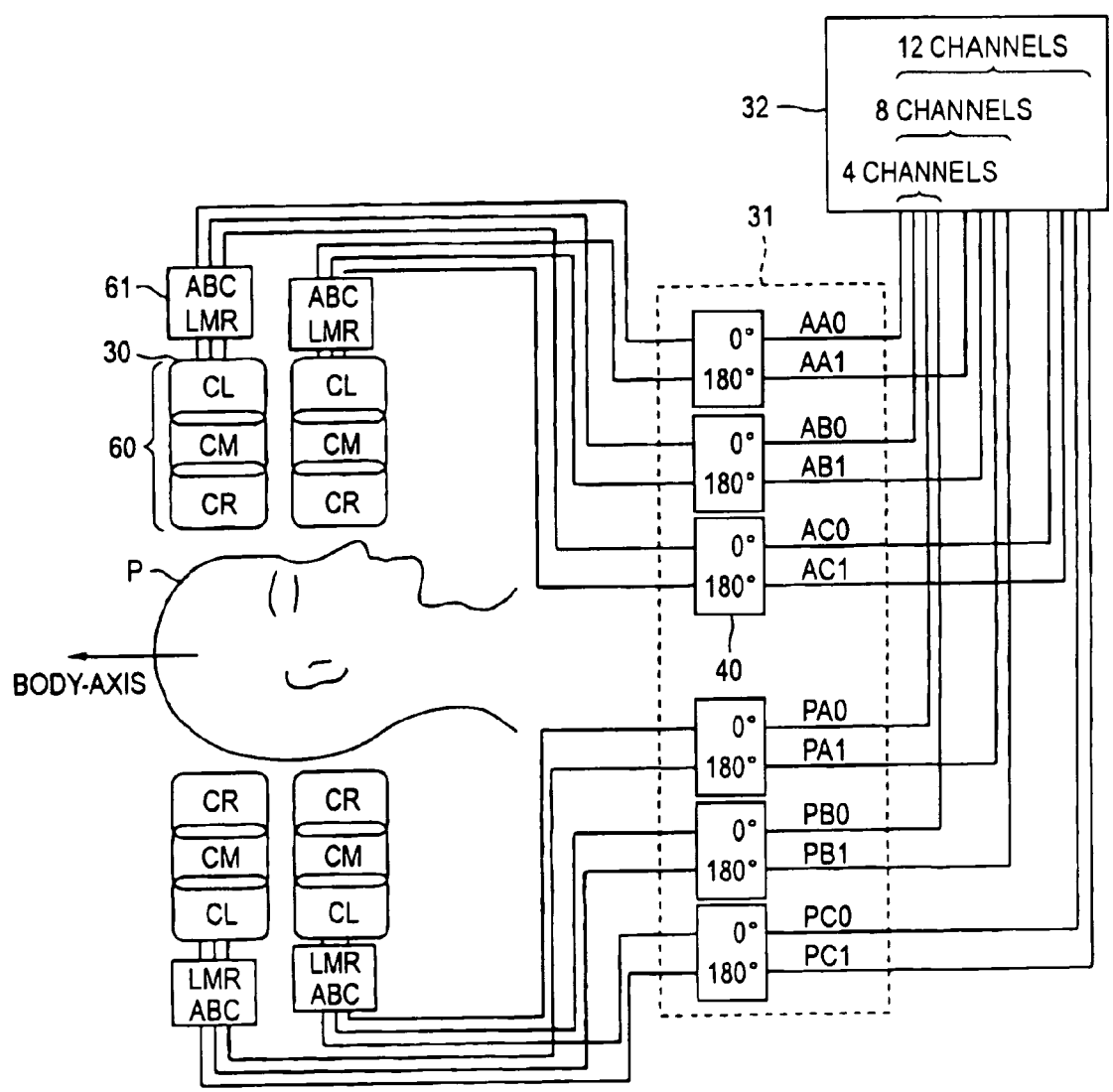
FIG. 13 is a diagram showing an example of arrangement of the surface coils when the plurality of surface coils for a head of the object are used as the receiving radio frequency coils of the magnetic resonance imaging apparatus shown in FIG. 1.

FIG. 13 is a diagram showing an example of arrangement of the surface coils 30 when the plurality of surface coils 30 for a head of the object P are used as the receiving radio frequency coils 17 of the magnetic resonance imaging apparatus 10 shown in FIG. 1.

As shown in FIG. 13, a pair of the surface coil units 60, each of which has three surface coils CL, CM, and CR disposed in the XY direction are disposed at the anterior side and the posterior side of the head of the object P, respectively. Further, the pair of surface coil units 60 are shifted in the body-axis direction. That is, the surface coil units 60 are shifted from each other in the body-axis direction, and are disposed at the anterior side and the posterior side of the head of the object P.

A distributing/combining circuit 61 is connected to the output port of each surface coil unit 60 that has the three surface coils CL, CM, and CR. Since each surface coil unit 60 has three output port from the each of the surface coils CL, CM, and CR, the distributing/combining circuit 61 for a non-body-axis direction also has three input channels and three output channels. That is, distributing and combining characteristic of the distributing/combining circuit 61 for a non-body-axis direction can be represented by a matrix of 3×3.

Figure 18:
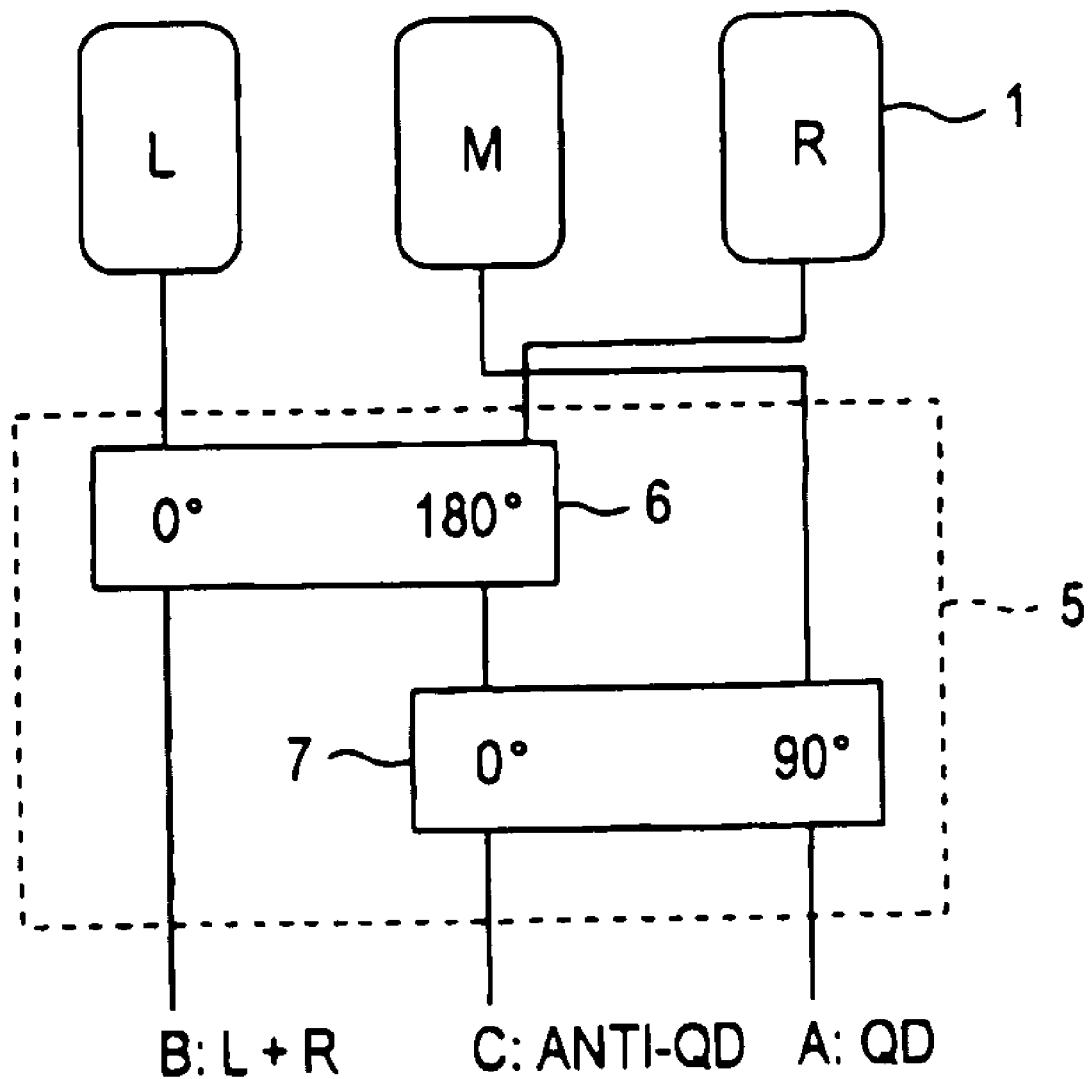
FIG. 18 is a circuit diagram of the distributing/combining circuit for combining signals received from the target surface coils in the magnetic resonance imaging apparatus according to a related art shown in FIG. 17.
Figure 19:
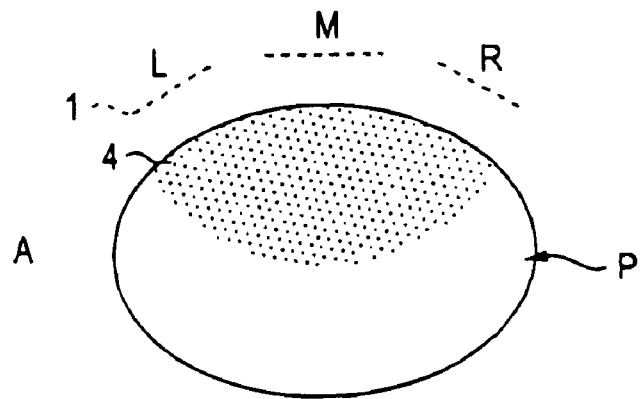
FIG. 19 is a diagram showing the sensitivity distribution formed by the surface coils L, M, R when the output signal A from the distributing/combining circuit 5 according to a related art shown in FIG. 18 is selected as a reception signal.
Figure 20:
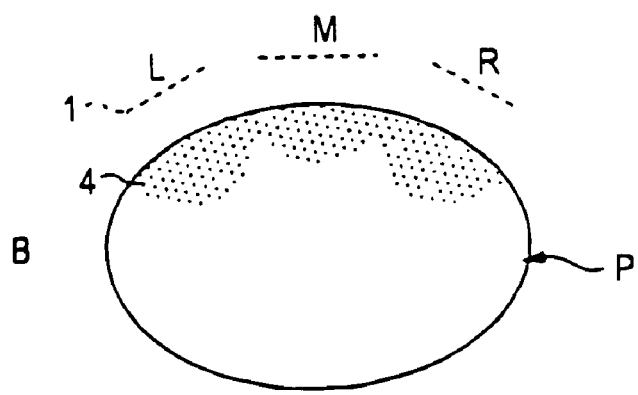
FIG. 20 is a diagram showing the sensitivity distribution formed by the surface coils when the output signal B from the distributing/combining circuit shown in FIG. 18 according to a related art is selected as a reception signal.
Figure 21:
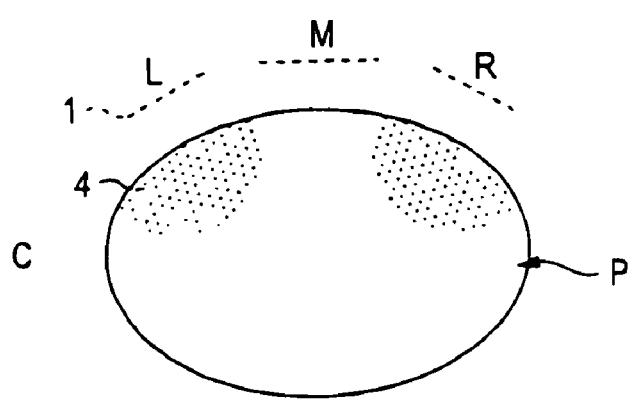
FIG. 21 is a diagram showing the sensitivity distribution 4 formed by the surface coils when the output signal C from the distributing/combining circuit shown in FIG. 18 according to a related art is selected as a reception signal.

Similar to the distributing/combining circuit 5 according to the related art shown in FIG. 18, the distributing/combining circuit 61 for a non-body-axis can be configured by using a 0°-90° hybrid circuit and a 0°-180° hybrid circuit 40. If the distributing/combining circuit 61 for a non-body-axis is constructed in the same manner as the distributing/combining circuit 5 according to the related art shown in FIG. 18, three reception signals A, B, and C are generated from the signals L, M, and R received from the three surface coils CL, CM, and CR.

In this case, the reception signal A is a QD signal corresponding a reception signal from a QD (quadrature detection) surface coil arranged by overlapping a figure-of-eight-shaped surface coil consisting of the surface coils CL and CR and the surface coil CM as a loop surface coil. Further, the reception signal B is a reception signal L+R that adds a reception signal L from the surface coil CL and a reception signal R from the surface coil CR, and the reception signal C is an anti-QD signal that is reversed with the QD signal. However, the distributing/combining circuit 61 for a non-body-axis direction may have the structures other than the circuit structure shown in FIG. 18.

In addition, through the signal distributing and combining operation by the distributing/combining circuit 61 for a non-body-axis direction, twelve reception signals are generated from the twelve reception signals that are output from the four surface coil units 60 provided at the anterior side and the posterior side of the head of the object P in the body-axis direction (Z direction). In this case, the reception signals A, B, and C that are output from the two distributing/combining circuits 61 provided at the anterior side of the head are denoted as the reception signals AA, AB, and AC, and the reception signals A, B, and C that are output from the two distributing/combining circuits 61 provided at the posterior side of the head are denoted as the reception signals PA, PB, and PC.

A distributing/combining circuit 31, which distributes and combines the signals received from the surface coils CL, CM, and CR shifted in the body-axis direction, is provided at the output side of the distributing/combining circuit 61 for a non-body-axis direction. The distributing/combining circuit 31 can be configured by using, for example, the 0°-180° hybrid circuit 40. FIG. 13 is a diagram showing an example where the surface coils CL, CM, and CR are disposed such that the signals received from the surface coils CL, CM, and CR shifted in the body-axis direction are respectively input to the six 0° to 180° hybrid circuits 40.

That is, the two reception signals AA, which are obtained from the surface coils CL, CM, and CR shifted in the body-axis direction by the distributing/combining circuit 61 for a non-body-axis direction, are input to the 0°-180° hybrid circuit 40. Similar to the two reception signals AA, the two reception signals AB, AC, PA, PB, and PC are also input to the same 0°-180° hybrid circuit 40. As a result, the reception signals AA0, AB0, AC0, PA0, PB0, and PC0, which are obtained by adding two reception signals AA, AB, AC, PA, PB, and PC, are output from the 0° output side of the 0°-180° hybrid circuit 40. Further, the reception signals AA1, AB1, AC1, PA1, PB1, and PC1, which are obtained by shifting phases of two reception signals AA, AB, AC, PA, PB, and PC by 180° and adding them, are output from the 180° output side of the 0°-180° hybrid circuit 40.

As a result, twelve reception signals that are obtained by forming a sensitivity region 50 having different modally switchable patterns are generated from the twelve surface coils 30. A switch circuit 32 is provided at the output side of the reception signals that are generated by the distributing/combining circuit 61 for a non-body-axis direction and the distributing/combining circuit 31 for a non-body-axis direction. The switch circuit 32 can selectively switch any one of the twelve reception signals, and supply it to the receiving unit 20 at the next stage.

Therefore, when the number of receiving channels included in the receiving unit 20, M is four, it is possible to select the reception signals AA0, AB0, PA0, and PB0 as reception signals. Further, when the number of receiving channels included in the receiving unit 20, M is eight, it is possible to select the reception signals AA0, AA1, AB0, AB1, PA0, PA1, PB0, and PB0 as reception signals. Furthermore, when the number of receiving channels included in the receiving unit 20, M is twelve, it is possible to select all of the reception signals AA0, AA1, AB0, AB1, AC0, AC1, PA0, PA1, PB0, PB0, PC0, and PC1 as reception signals. That is, when the number of receiving channels, M is large, the magnetic resonance imaging apparatus 10 can be configured such that high-speed parallel imaging can be performed.

In the example shown in FIG. 13, after the reception signals from the surface coils 30 shifted in a direction vertical to the body axis are distributed and combined by the distributing/combining circuit 61 for a non-body-axis direction, the reception signals corresponding to the reception signals from the surface coils 30 shifted in a direction vertical to the body axis are distributed and combined by the distributing/combining circuit 31 for a non-body-axis direction. In contrast, after the reception signals from the surface coils 30 shifted to the body-axis direction are distributed and combined by the distributing/combining circuit 31 for a non-body-axis direction, the reception signals corresponding to the reception signals from the surface coils 30 shifted in a direction vertical to the body axis are distributed and combined by the distributing/combining circuit 61 for a non-body-axis direction. That is, the distributing/combining circuit 61 for a non-body-axis direction may be provided at the output side of the distributing/combining circuit 31 for a non-body-axis direction.

Further, as in the example of FIG. 13, the distributing and combining of the reception signals in the body-axis direction may not be performed with respect to all of the surface coils 30 disposed in the non-body-axis direction. That is, in the example of FIG. 13, the reception signals AA0, AA1, AB0, AB1, AC0, and AC1 from the surface coils 30 that are disposed at the anterior side are distributed and combined, and the signals PA0, PA1, PB0, PB1, PC0, and PC1 received from the surface coils 30 that are disposed at the posterior side are separately distributed and combined.

As such, only the signals received from a portion of the surface coils 30 that are disposed in a non-body-axis direction according to a diagnosis object can be distributed and combined. Accordingly, only the signals received from the surface coils 30 that are disposed at either the anterior side or the posterior side may be distributed or combined. In contrast, the signals received from the surface coils 30 that are disposed at the anterior side and the posterior side may be distributed or combined. Further, when the plurality of surface coils 30 are disposed in the non-body-axis direction, a plurality of groups of the reception signals to be distributed may be formed.

As described above, the signals received from the respective surface coils 30 can be distributed and combined by the distributing/combining circuit 31. However, it may be important that an imaging process can be performed on a narrow region with superior sensitivity while using all or a portion of the surface coils 30 independently. Accordingly, it may be configured such that a switch is provided at the output side of each surface coil 30, and the switch switches the output destination of each surface coil 30 into a path toward the receiving unit 20 via the distributing/combining circuit 31 and a path toward the receiving unit 20 without passing through the distributing/combining circuit 31.

Figure 14:
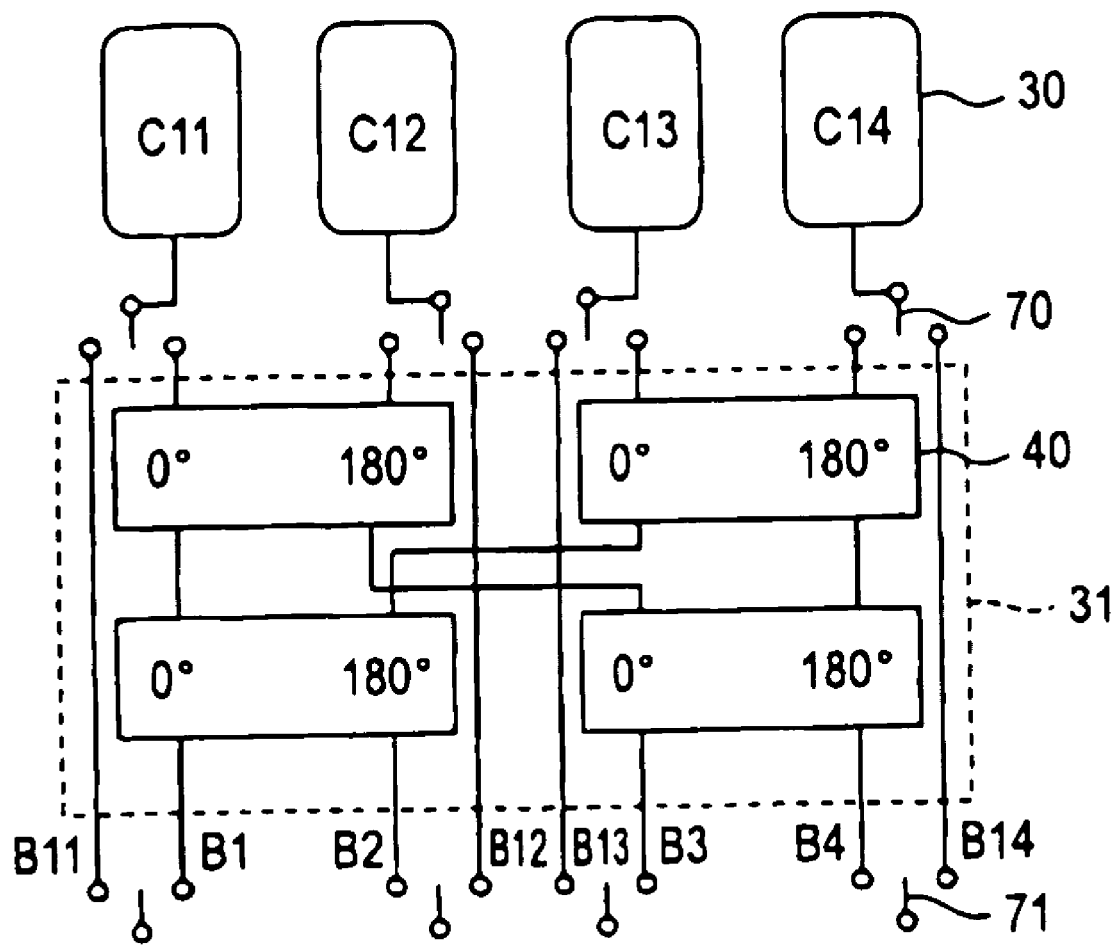
FIG. 14 is a diagram showing an example where four surface coils are provided as the receiving radio frequency coils of the magnetic resonance imaging apparatus shown in FIG. 1, and a switch is provided at the output side of each surface coil.
Figure 15:
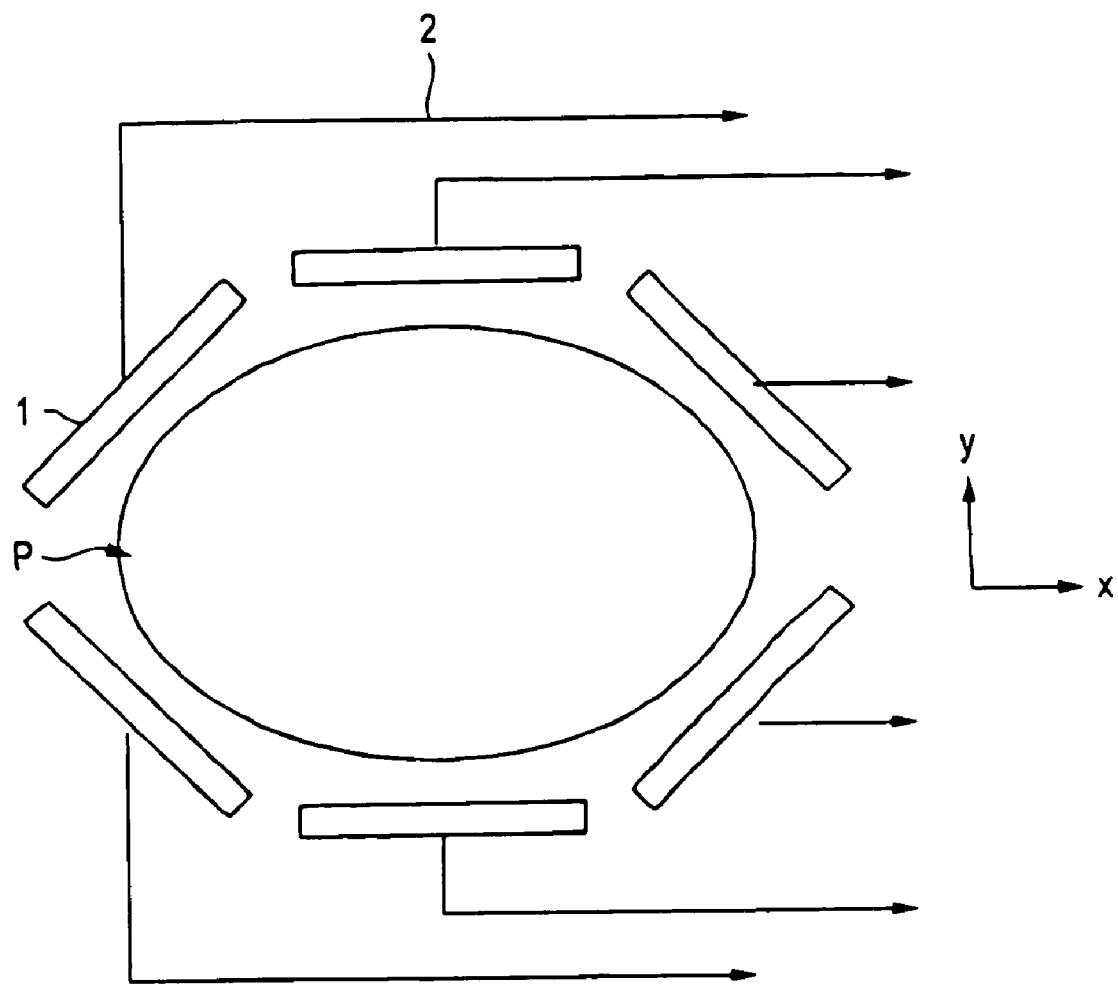
FIG. 15 is a diagram showing an example in which a plurality of surface coils are disposed around an abdominal region of the object in the parallel imaging by a magnetic resonance imaging apparatus according to a related art.
Figure 16:
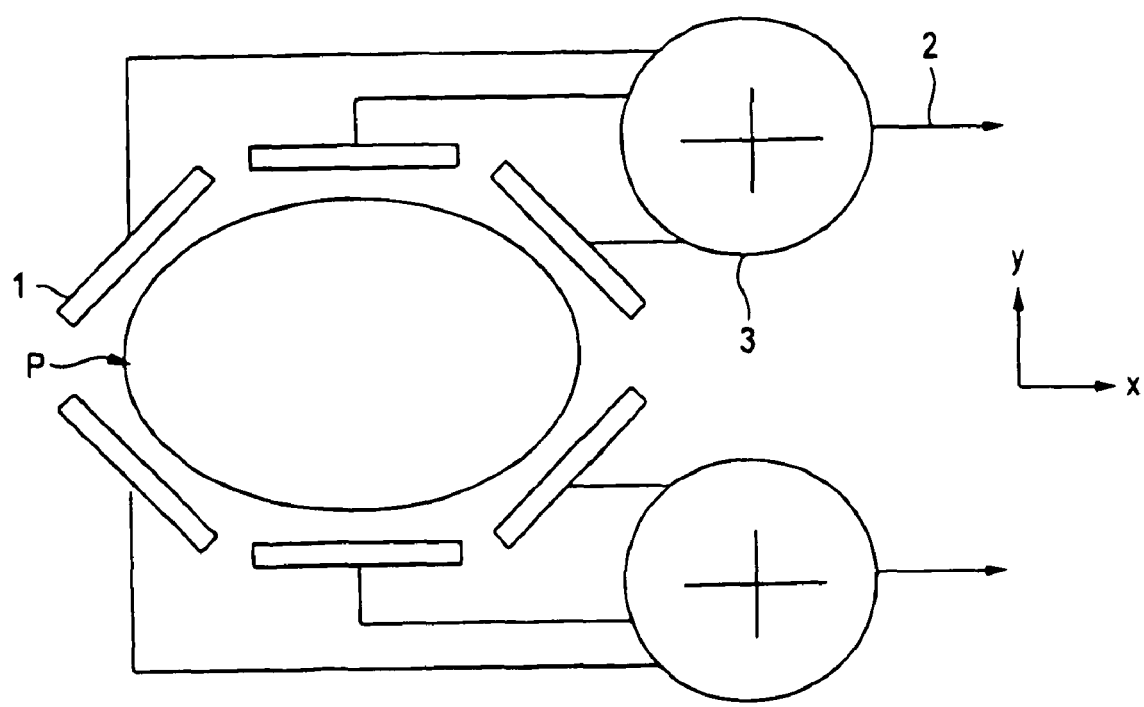
FIG. 16 is a conceptual diagram showing an example configured to combine reception signals from a plurality of surface coils using a combining/switch circuit in parallel imaging by a magnetic resonance imaging apparatus according to a related art.
Figure 17:
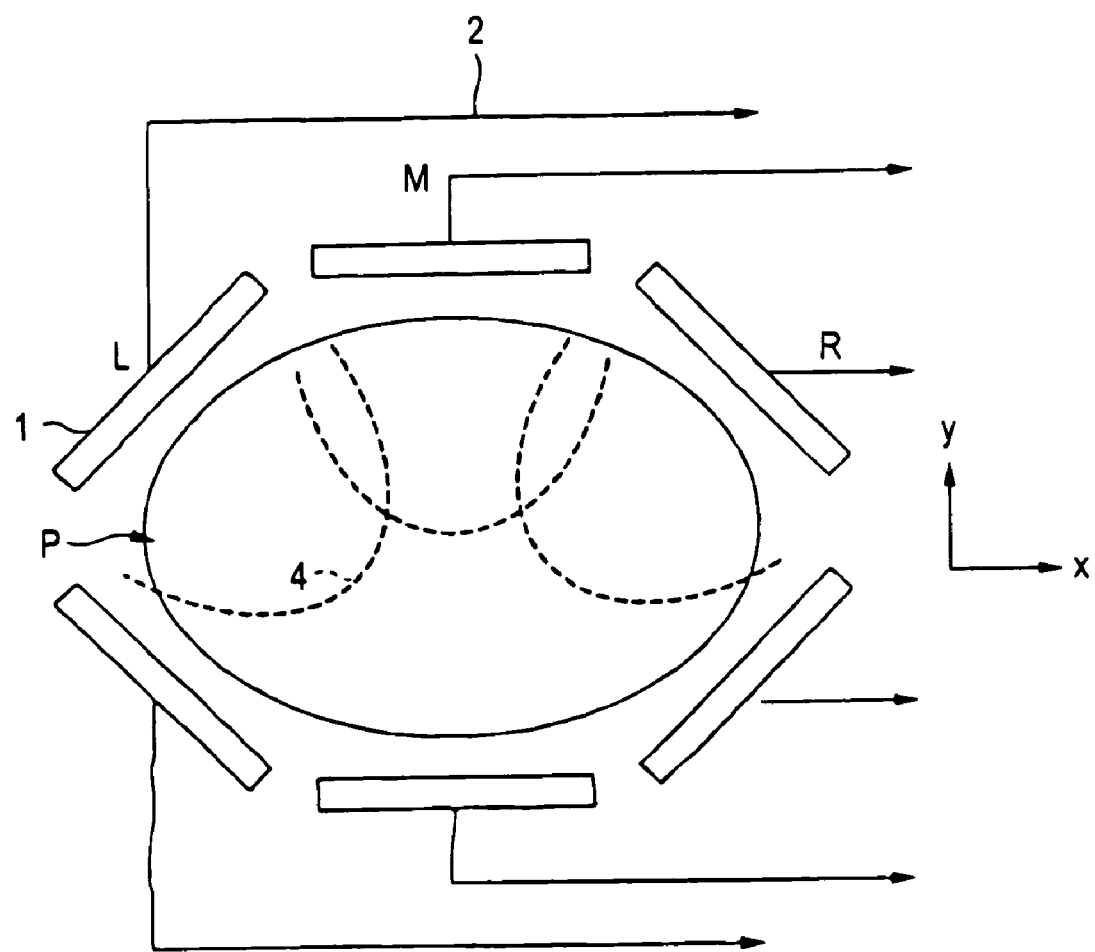
FIG. 17 is a diagram showing a sensitivity distribution of three target surface coils among six surface coils arranged around the abdominal region of the object in parallel imaging by a magnetic resonance imaging apparatus according to a related art.

FIG. 14 is a diagram showing an example where four surface coils 30 are provided as the receiving radio frequency coils 17 of the magnetic resonance imaging apparatus 10 shown in FIG. 1, and a switch is provided at the output side of each surface coil 30.

As shown in FIG. 14, it can be configured such that the switches 70 are respectively provided at the output sides of the surface coils C11, C12, C13, and C14, and the switches selectively switch a path for guiding the reception signals to the distributing/combining circuit 31, and a path for guiding the reception signals to the switch circuit 32 and the receiving unit 20 without passing through the distributing/combining circuit 31. Further, the switch 71 may be provided at the input side of the switch circuit 32 at the next stage, and the switch selectively switch a path for guiding the reception signals to the switch circuit 32 after passing through the distributing/combining circuit 31, and a path for guiding the reception signals to the switch circuit 32 without passing through the distributing/combining circuit 31. According to the above-mentioned structure, through the switching operation of the switch 70, the surface coil 30 can be independently used, and parallel imaging can be performed by using the plurality of surface coils 30.

Then, the operation and the effects of the magnetic resonance imaging apparatus 10 will be described.

First, the surface coils 30 necessary for diagnosis are disposed at predetermined locations in advance. Even if the number of the surface coils 30, N is not less than the number of the receiving channels, M in the receiving unit 20, the surface coils can be disposed. For example, if the number of the surface coils C11, C12, C13, and C14 for a body shown in FIG. 6 or the surface coils CL, CM, and CR for a head shown in FIG. 13 or the surface coils 30 for any other portion is large, it is possible to reduce a work of replacing the surface coil 30.

Then, after the object P is laid on a bed 16, a static magnetic field is uniformly applied to the object P that is set in an imaging area by a static magnetic magnet 13. Further, in a sequence controller 26 by operating a console 23, a sequence for defining predetermined scanning conditions is read out from a storage device in a calculator 22. At this time, in accordance with the sequence set by the user, surface coils 30 used for scanning are determined, and a sensitivity region 50 formed by the surface coil 30 and a mode of reception signals used for imaging are selected. The selected mode is selected such that, in accordance with the size relationship between the number of the receiving channels M and the number N of the surface coils 30 included in the receiving unit 20, the signals received from the sensitivity region 50 important to diagnosis are preferentially and selectively received in the receiving unit 20.

In addition, the sequence controller 26 supplies control signals to the gradient magnetic field coil driving circuit 18, the transmitting unit 19, the receiving unit 20, and the data collecting unit 21 in accordance with the read sequence. In this case, in accordance with the control signal received from the sequence controller 26, the gradient magnetic field coil driving circuit 18 supplies driving signals to an X-axis gradient magnetic field coil, a Y-axis gradient magnetic field coil, and a Z-axis gradient magnetic field coil of the gradient magnetic field coil unit 14, thereby forming in an imaging area desired gradient magnetic fields Gx, Gy, and Gz whose magnetic field intensity linearly varies in an X axis, a Y axis, and a Z axis, respectively.

As such, in a state in which the static magnetic field and the gradient magnetic field are applied to the object P, the transmitting unit 19 applies a radio frequency pulse to the transmitting radio frequency coil 15 in accordance with the control signal received from the sequence controller 26. In accordance with the radio frequency pulse received from the transmitting unit 19, the transmitting radio frequency coil 15 transmits the radio frequency pulse to the object that is disposed in the imaging area. For this reason, a magnetic resonance signal is generated in the object P, and then received by a plurality of surface coils 30 that are used as the receiving radio frequency coils 17.

The magnetic resonance signal that is received by each surface coil 30 is converted into an electric signal, and then output to a combining and switch circuit 25 as a reception signal. When the plurality of surface coils 30 are arranged in only a body-axis direction as shown in FIG. 3 or 7, the reception signal output from the surface coil 30 is input to the distributing/combining circuit 31. In addition, the reception signal corresponding to the desired sensitivity region 50 is generated in the distributing/combining circuit 31, and then output to the switch circuit 32 that is provided at the next stage of the distributing/combining circuit 31. At this time, when the distributing/combining circuit 31 is configured by the passive circuit as the 0°-180° hybrid circuit 40, the power consumed by the distributing/combining circuit 31 is suppressed from being increased.

Further, when the plurality of surface coils 30 are disposed in not only the body-axis direction but also a direction vertical to the body axis as shown in FIG. 18, the magnetic resonance signal that is received by the surface coil 30 is output to the distributing/combining circuit 61 for a non-body-axis direction. The distributing/combining circuit 61 for a non-body-axis direction distributes and combines the signals received from the plurality of surface coils 30 that are disposed in the non-body-axis direction. In addition, the reception signals, such as QD signals, are generated, and output to the distributing/combining circuit 31 for a body-axis direction.

Then, the distributing/combining circuit 31 for a body-axis direction distributes and combines the signals received from the plurality of surface coils 30 that are shifted in the body-axis direction, and generates a new reception signal. The generated reception signal is output from the distributing/combining circuit 31 for a body-axis direction to the switch circuit 32.

Further, when the switches 70 and 71 are provided in the distributing/combining circuit 31 and the switch circuit 32, respectively, the reception signals from any surface coil 30 can be independently guided to the switch circuit 32 without combining the reception signals from any surface coil 30 to the reception signals from another surface coil 30 by operating the switches 70 and 71.

In this way, the reception signals output from the surface coils 30 are distributed and combined by the distributing/combining circuit 31, and then guided to the switch circuit 32. The switch circuit 32 selects the number of reception signals of corresponding to M the receiving channels included in the receiving unit 20. That is, when the surface coil 30 having N coils is used, the N reception signals are guided to the switch circuit 32, or the switch circuit 32 selects the number of the reception signals corresponding to the M receiving channels, and supplies them to the receiving unit 20.

Therefore, the reception signals selected by the switch circuit 32 are input to the receiving channels of the receiving unit 20. Under control by the sequence controller 26, the respective reception signals are amplified and detected by the receiving unit 20 and then transmitted to the data collecting unit 21. As a result, the reception signals are collected in the data collecting unit 21. In the data collecting unit 21, an A/D conversion process is performed on the collected reception signals, and the reception signals are transmitted to the calculator 22 after the A/D conversion process.

Then, if the user instructs the image display through the console 23, an image reconstructing process is performed on the reception signals input by the data collecting unit 21 in the calculator 22. Generally, the reception signals from each surface coil 30 are independently subjected to the image reconstructing process. Therefore, the number of images according to the number of the surface coils 30, the number of the receiving channels, and the number of the image signals to be subjected to the image reconstructing process are reconstructed. The reconstructed images are combined as one image by an image combining process, such as a process of taking the square root and the like, in the calculator 22. Further, image processes necessary for parallel imaging, such as an unfolding process, are appropriately performed.

In addition, the image data that is obtained by the reconstructing process and the combining process is supplied to the display 24 so as to be displayed thereon. Therefore, it is possible for the user to reference diagnosis images having improved SNR at high speed through the parallel imaging using the plurality of surface coils 30.

According to the magnetic resonance imaging apparatus 10, the method of processing the receiving data in the magnetic resonance imaging apparatus 10, and the radio frequency coils that are described above, it is possible to distribute and synthesize the signals received from the plurality of surface coils 30 that are disposed in the body-axis direction of the object P. Accordingly, even when the number of the receiving channels of the magnetic resonance imaging apparatus 10 is small, it is possible to increase a range for selecting a mode for performing parallel imaging in all of X, Y, and Z directions. As a result, even when the number of the surface coils 30 disposed in the body-axis direction is increased, it is possible to ensure a large imaging area with a simple circuit structure and the reduced number of channels. In particular, the present embodiment is suitable for a case in which a large region of the object in the body-axis direction are imaged by using the magnetic resonance imaging apparatus 10 in which the plurality of surface coils 30 are disposed in the body-axis direction.

Further, the distributing/combining circuit 31 is provided so as to be separated from the switch circuit 32, and thus the circuit structure of the synthesis and switch circuit 25 can be simplified. Furthermore, since a portion of the distributing/combining circuit 31 can be configured as a passive circuit, it is possible to achieve low power consumption in the entire combining/switch circuit 25.

Further, in a case in which the distributing/combining circuit 31 for a body-axis direction is configured by hierarchically disposing only the 0°-180° hybrid circuit 40 without using the 0°-90° hybrid circuit 40, it is possible to construct the distributing/combining circuit 31 that is suitable for combining the reception signals from the surface coils 30 disposed in the body-axis direction. That is, the distributing/combining circuit 31 is configured by using only the 0°-180° hybrid circuit 40, which does not cause the noise components included in the reception signals from the plurality of surface coils 30 that are two-dimensionally disposed. Therefore, it is possible to suppress the noise components in the combined reception signals from being increased.

Further, when the switch 70 is provided such that the reception signals from the respective surface coils 30 can be applied to the receiving unit 20 without being distributed and combined by the distributing/combining circuit 31, it is possible to cope with needs requiring that individual surface coils 30 are independently used, and a narrow region is imaged with superior sensitivity.

What is claimed is:

1. A radio frequency (RF) coil unit comprising:
a plurality of RF surface coils arranged in a body-axis direction of an object to be imaged in an MRI system; and
an RF signal distributing/combining unit configured to produce new RF reception signals, forming respectively corresponding plural RF sensitivity distributions respectively different from RF sensitivity distributions of the plurality of surface coils, by distributing and combining RF reception signals from the plurality of RF surface coils in the body-axis direction.

2. The radio frequency coil unit according to claim 1 wherein:
the distributing/combining unit is configured such that a distribution and combining characteristic is represented by a matrix having an inverse matrix of N×N when the number of the surface coils is N.

3. The radio frequency coil unit according to claim 1 wherein:
the distributing/combining unit has only passive 0°-180° hybrid circuits.

4. The radio frequency coil unit according to claim 1 wherein:
the number of surface coils are four or more.

5. The radio frequency coil unit according to claim 1, further comprising:
a path changing switch that switches a path of the reception signals output from the plurality of surface coils between a path passing through the distributing/combining unit and a path not passing through the distributing/combining unit.

6. The radio frequency coil unit according to claim 1, wherein:
the plurality of surface coils includes surface coils that are arranged in a direction vertical to the body-axis direction,
a distributing/combining unit of a non-body-axis direction that distributes and combines reception signals in the direction vertical to the body-axis direction to output new reception signals from the surface coils arranged in the direction vertical to the body-axis direction,
the distributing/combining units distributing and combining reception signals obtained on the basis of reception signals from the surface coils arranged in the body-axis direction, reception signals distributed and combined by the distributing/combining unit of the non-body-axis direction and reception signals before being distributed and combined by the distributing/combining units, to produce new reception signals.

7. The radio frequency coil unit according to claim 1, wherein:
the plurality of surface coils includes a first surface coil, a second surface coil, a third surface coil, and a fourth surface coil, the distributing/combining units include a first 0°-180° hybrid circuit that is provided at output sides of the first and second surface coils, a second 0°-180° hybrid circuit that is provided at output sides of the third and fourth surface coils, a third 0°-180° hybrid circuit that is provided at a 0° output side of the first 0°-180° hybrid circuit and at a 0° output side of the second 0°-180° hybrid circuit, and a fourth 0°-180° hybrid circuit that is provided at a 180° output side of the first 0°-180° hybrid circuit and at a 180° output side of the second 0°-180° hybrid circuit.

8. A method for processing radio frequency (RF) MRI signals from an MRI radio frequency coil unit, said method comprising:

arranging a plurality of RF surface coils in a body-axis direction of an object to be imaged in an MRI system, and producing new RF reception signals, forming respectively corresponding plural RF sensitivity distributions respectively different from RF sensitivity distributions of the plurality of surface coils, by distributing and combining RF reception signals from the plurality of surface coils in the body-axis direction.

9. The method according to claim 8 wherein:

the distributing and combining process has a distribution and combining characteristic represented by a matrix having an inverse matrix of N×N when the number of the surface coils is N.

10. The method according to claim 8 wherein:

the distributing and combining steps use only passive 0°-180° hybrid circuits.

11. The method according to claim 8 wherein:

the number of surface coils are four or more.

12. The method according to claim 8, further comprising:

switch-changing a path of the reception signals output from the plurality of surface coils between a path including the distributing and combining steps and a path not including the distributing and combining steps.

13. The method according to claim 8 wherein:

the plurality of surface coils includes surface coils that are arranged in a direction orthogonal to the body-axis direction, distributing and combining reception signals in the direction orthogonal to the body-axis direction to output new reception signals from the surface coils arranged in the direction orthogonal to the body-axis direction, the distributing and combining steps distributing and combining reception signals obtained on the basis of reception signals from the surface coils arranged in the body-axis direction, reception signals distributed and combined by the distributing/combining unit of the orthogonal direction and reception signals as they existed before being distributed and combined to produce new reception signals.

14. The method according to claim 8 wherein:

the plurality of surface coils includes a first surface coil, a second surface coil, a third surface coil, and a fourth surface coil, the distributing and combining steps use a first 0°-180° hybrid circuit provided at output sides of the first and second surface coils, a second 0°-180° hybrid circuit provided at output sides of the third and fourth surface coils, a third 0°-180° hybrid circuit provided at a 0° output side of the first 0°-180° hybrid circuit and at a 0° output side of the second 0°-180° hybrid circuit, and a fourth 0°-180° hybrid circuit provided at a 180° output side of the first 0°-180° hybrid circuit and at a 180° output side of the second 0°-180° hybrid circuit.

* * * * *